(12) United States Patent
Nichol (10) Patent No.: US 9,751,775 B2
(45) Date of Patent: Sep. 5, 2017

(54) PROCESS FOR MAKING HIGH PURITY ALUMINUM OXIDE

(71) Applicant: Polar Sapphire Ltd., Toronto (CA)

(72) Inventor: Scott Nichol, Toronto (CA)

(73) Assignee: Polar Sapphire Ltd., Toronto, Ontario (CA)

( * ) Notice: Subject to any disclaimer, the term of this patent is extended or adjusted under 35 U.S.C. 154(b) by 101 days.

(21) Appl. No.: 14/652,161

(22) PCT Filed: Dec. 17, 2013

(86) PCT No.: PCT/CA2013/050976
§ 371 (c)(1),
(2) Date: Jun. 15, 2015

(87) PCT Pub. No.: WO2014/094155
PCT Pub. Date: Jun. 26, 2014

(65) Prior Publication Data
US 2015/0368117 A1  Dec. 24, 2015

Related U.S. Application Data (60) Provisional application No. 61/737,925, filed on Dec. 17, 2012.

(51) Int. Cl.
*C01F 7/00*  (2006.01)
*C01F 7/42*  (2006.01)
(Continued)

(52) U.S. Cl.
CPC .............. *C01F 7/42* (2013.01); *C01F 7/30* (2013.01); *C01F 7/441* (2013.01); *C01F 7/56* (2013.01);
(Continued)

(58) Field of Classification Search
CPC ...... C01F 7/42; C01F 7/30; C01F 7/56; C01F 7/441
(Continued)

(56) References Cited

U.S. PATENT DOCUMENTS 2,217,099 A * 10/1940 Burman .............. C01F 7/22
                                                423/123
2,249,761 A *  7/1941 Hixson .............. C01F 7/22
                                                423/112
(Continued)

FOREIGN PATENT DOCUMENTS

CA      1224327 A1    7/1987
CA      2137249 A1   12/1993
(Continued)

OTHER PUBLICATIONS

Translation of Chinese Office action for application: CN2013/80069255.7, dated Aug. 2016.*

(Continued)

*Primary Examiner* — Steven Bos
(74) *Attorney, Agent, or Firm* — Schwegman Lundberg & Woessner, P.A.

(57) ABSTRACT

A method comprising contacting high-purity acid, high-purity aluminum, and high-purity water to form a first solution in a heated non-contaminating vessel, wherein the aluminum is employed in at least a stoichiometric amount relative to the acid, heating the first solution in a non-contaminating container, to provide a mother liquor and solid aluminum salts, separating the solid aluminum salts from the mother liquor, heating the solid aluminum salts in a non-contaminating crucible, to provide alpha aluminum oxide, and, optionally, washing the alpha aluminum oxide with high-purity water after some or all of the heating of the solid aluminum salts to provide the alpha aluminum oxide.

21 Claims, 1 Drawing Sheet

(51) Int. Cl.

| | | |
|---|---|---|
| *C30B 29/20* | (2006.01) | |
| *C30B 35/00* | (2006.01) | |
| *C01F 7/30* | (2006.01) | |
| *C01F 7/44* | (2006.01) | |
| *C01F 7/56* | (2006.01) | |

(52) U.S. Cl.
CPC ............ *C30B 29/20* (2013.01); *C30B 35/007* (2013.01); *C01P 2006/80* (2013.01)

(58) Field of Classification Search
USPC .......................................... 423/122–129, 626
See application file for complete search history.

(56) References Cited

U.S. PATENT DOCUMENTS

| | | | | |
|---|---|---|---|---|
| 3,211,524 | A * | 10/1965 | Hyde ........................ | C01F 7/24 423/112 |
| 3,647,373 | A * | 3/1972 | Huska ..................... | C01F 7/308 422/139 |
| 4,151,267 | A | 4/1979 | Puskas | |
| 4,224,287 | A * | 9/1980 | Ziegenbalg ............... | C01F 7/22 423/112 |
| 4,486,402 | A * | 12/1984 | Gurtner .................... | C01F 7/22 23/305 A |
| 4,634,581 | A * | 1/1987 | Cambridge ............. | C01F 7/306 423/126 |
| 6,106,800 | A * | 8/2000 | Mohri ....................... | C01F 7/02 423/625 |
| 2004/0101500 | A1 * | 5/2004 | Ashcroft ................. | A61K 8/26 424/70.1 |
| 2008/0181840 | A1 * | 7/2008 | Steelhammer ......... | B01J 27/128 423/495 |

FOREIGN PATENT DOCUMENTS

| | | |
|---|---|---|
| CN | 1374252 A | 10/2002 |
| CN | 102040236 A | 5/2011 |
| CN | 102502739 A | 6/2012 |
| CN | 104903241 A | 9/2015 |
| EP | 0644279 A1 | 3/1995 |
| GB | 802731 * | 10/1958 |
| WO | WO-2014094155 A1 | 6/2014 |

OTHER PUBLICATIONS

Translation of CN102502739, dated Jun. 2012.*
Machine translation of Response filed Apr. 10, 2017 to Office action dated Jan. 25, 2017 for Chinese application 2013-80069255.7.*
"International Application Serial No. PCT/CA2013/050976, International Search Report dated Mar. 20, 2014", 5 pgs.
"International Application Serial No. PCT/CA2013/050976, Written Opinion dated Mar. 20, 2014", 6 pgs.
Liu, Q, et al., "High purity alumina powders extracted from aluminum dross by the calcining-leaching process", Light Metals, USA: John Wiley & Sons, Inc., 2011, ISBN: 9781118029350, (2011), pp. 197-200.
"Chinese Application Serial No. 201380069255.7, Office Action dated Jan. 25, 2017", 10 pgs.
"Chinese Application Serial No. 201380069255.7, Office Action dated Jan. 28, 2016", 11 pgs.
"Chinese Application Serial No. 201380069255.7, Office Action dated Aug. 18, 2016", Without English Translation, 15 pgs.
"Chinese Application Serial No. 201380069255.7, Response filed Jun. 13, 2016 to Office Action dated Jan. 28, 2016", W/English Translation of Claims, 14 pgs.
"Chinese Application Serial No. 201380069255.7, Response filed Nov. 2, 2016 to Office Action dated Aug. 18, 2016", English Translation of Claims, 24 pgs.
"International Application Serial No. PCT/CA2013/050976, International Preliminary Report on Patentability dated Jul. 2, 2015", 8 pgs.
"Chinese Application Serial No. 201380069255.7, Response filed Apr. 10, 2017 to Office Action dated Jan. 25, 2017", 20 pgs.

* cited by examiner

FIG. 1

PROCESS FOR MAKING HIGH PURITY ALUMINUM OXIDE

CROSS-REFERENCE TO RELATED APPLICATION

This application is a U.S. National Stage filing under 35 U.S.C. §371 from International Patent Application Serial No. PCT/CA2013/050976, filed Dec. 17, 2013, published on Jun. 26, 2014 as WO2014/094155 A1, which claims the benefit of priority of U.S. Provisional Patent Application Ser. No. 61/737,925, filed on Dec. 17, 2012, which application is incorporated by reference herein in its entirety.

BACKGROUND

High purity aluminum oxide or alumina powder can be used to make; translucent tubes for high-pressure sodium lamps, sapphires for watch covers, high-strength ceramic tools, abrasives for magnetic tape, manufacturing light emitting diodes as a substrate for GaN, silicon microchip wafers for optic-electronics, windows and cowls for aircrafts, protective windows for car headlamps, cell phones and other electronic devices, stop signals, surgery scalpels, micro-optical elements of medical fiber-optic probes, optical scanners for bar codes, ultraviolet CD and DVD optical systems, prisms, lenses, optical plates, optical systems of visual and IR diapasons, cell phone, mobile devices and fiber-optic system display windows, equipment for chemical manufacturing in aggressive and high-temperature environments: tubes, crucibles, funnels, chemical glassware, abrasives, battery components, bearings and jewelry stones.

Currently the most common methods of making high purity alumina for manufacturing Sapphire for LED substrates are aluminum-ammonium-sulfate thermal decomposition, aluminum-ammonium-carbonate thermal decomposition and aluminum-isopropoxide hydrolyzation. The high purity alumina is then used in the Verneuil process to make crackle or compressed into densified pucks, granules or beads for melting in a sapphire ingot furnace.

These processes are well known. A low cost process, which uses less energy, is needed to make high purity alumina for manufacturing low-cost sapphire, such as can be used for sapphire substrates for LEDs.

Most past work in the field of alumina purification used aluminum trihydrate, Bauxite, gibbsite, aluminum oxides or ores containing aluminum oxide as the starting raw material for the process. Using aluminum as the starting raw material for manufacturing high purity aluminum oxide is very difficult due to the fact that it is difficult to control the reaction rate of the acid with the aluminum. High purity aluminum reacts very slowly with acid and then can very quickly accelerate into a very quick exothermic reaction. At each step of the process the feedstock can be contaminated by the reaction vessel, furnace or holding container. It is very important to use the correct materials and to control the reaction and temperature at each step to prevent contamination in the process in order to reach a high purity with a low cost. In the past it has been difficult to dissolve high purity aluminum economically in acid due to the fact that the higher the purity of the aluminum the slower the reaction with the acid. Use of aluminum with very high surface area will increase costs and potentially cause a runaway reaction due to the exothermic reaction.

Most of the past research done on using acids to process ores high in aluminum content into aluminum oxide was done to make a feedstock for producing primary aluminum. These processes are concerned with reaching the purity limits for the Hall-Heroult process but are not focused on reaching 4-6N purity requirements require to make a sapphire grade LED substrates or alumina for other high purity applications. Conventional high purity alumina typically has the following impurities: Na<10 ppmw, Fe<5 ppmw, Si<10, Ti<3, Mg<2, Ca<2, with 99.99% or 4N aluminum oxide purity. 5N purity alumina as feedstock for sapphire ingots can increase the yield and through put for the sapphire ingot making process and the LED manufacturing process.

Overview

A batch process of producing high purity aluminum oxide powder comprising
  a) Reacting a high purity acid or combination of high purity acids with high purity aluminum in high purity water in a controlled reaction above;
  b) Optionally filtering the liquid to remove impurities
  c) Heating the liquid or injecting an acid gas into the liquid to form aluminum salt crystals and a mother liquor;
  d) Separating the mother liquor from the aluminum salt crystals;
  e) Optionally adding water to the aluminum salt crystals and repeating steps b), c) and d); and
  f) heating the aluminum salt crystals to convert the aluminum salt crystals to alpha alumina.

BRIEF DESCRIPTION OF THE DRAWING

In the drawings, like numerals can be used to describe similar elements throughout the several views. Like numerals having different letter suffixes can be used to represent different views of similar elements. The drawings illustrate generally, by way of example, but not by way of limitation, various examples discussed in the present document.

DETAILED DESCRIPTION

In the following Detailed Description, reference is made to the accompanying drawing which form a part hereof. The drawing show, by way of illustration, a specific example in which a process of producing a high-purity aluminum oxide can be practiced. The examples are described in sufficient detail to enable those skilled in the art to practice, and it is to be understood that other embodiments can be utilized and that changes can be made without departing from the scope of the present disclosure. Therefore, the following Detailed Description is not to be taken in a limiting sense, and the scope of the present disclosure is defined by the appended claims and their equivalents.

Figure 1:
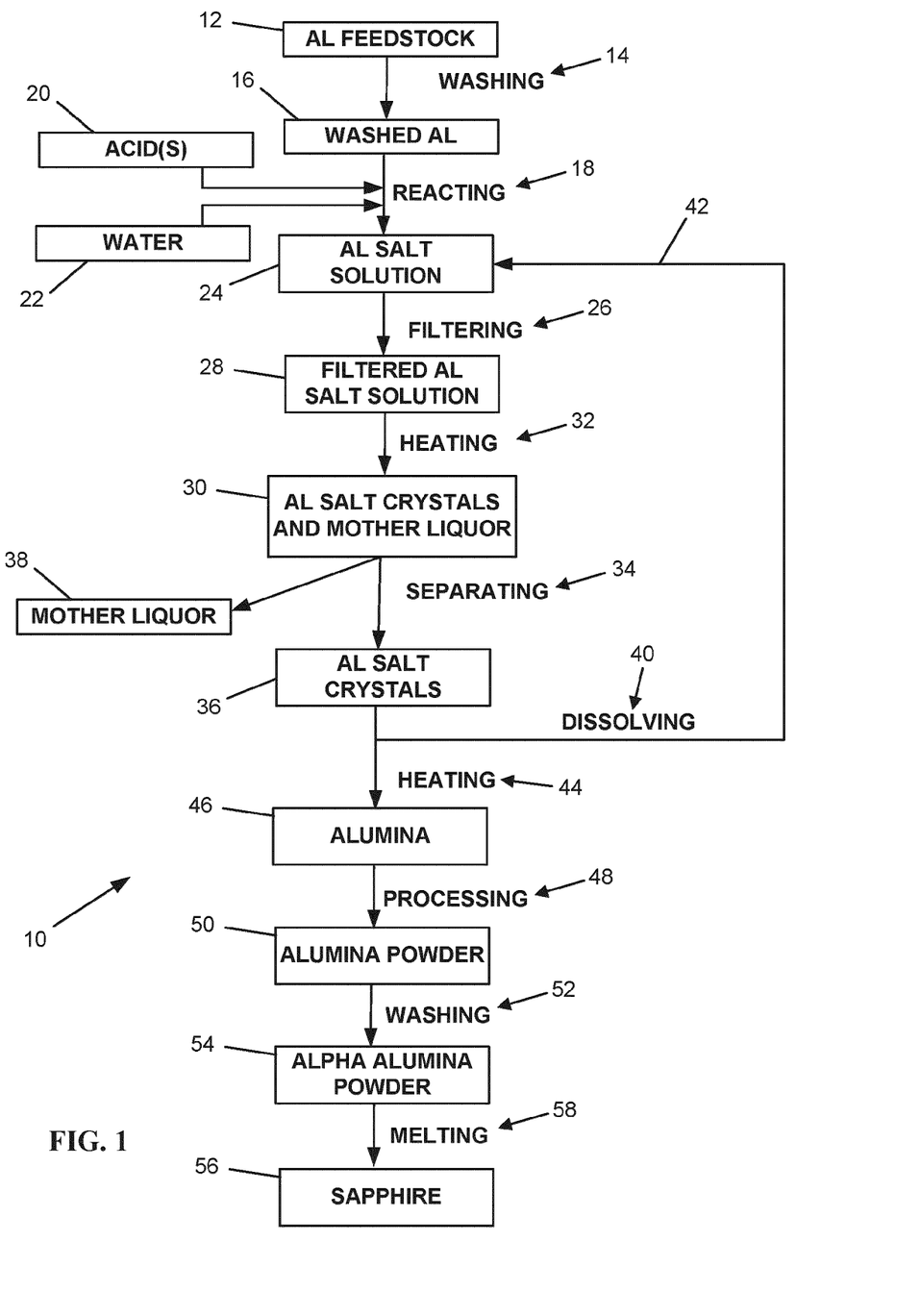
FIG. 1 is a flow diagram of an example process of producing high-purity aluminum oxide.

FIG. 1 shows a flow diagram of an example process 10 for producing high-purity aluminum oxide, for example to be used in the production of synthetic sapphire. An aluminum feedstock 12 can be provided. In an example, the aluminum feedstock 12 can comprise high-purity aluminum from the three-layer electrolytic process, also known as the Hoope process. The aluminum feedstock can have a purity of 99.98 wt. % aluminum or greater, such as 99.99 wt. % aluminum or greater, for example 99.995 wt. % aluminum or greater. In an example, less than 0.02 wt. % of the total impurities are metallic impurities. In an example, each metallic element impurity is less than 0.01 wt. %. High-purity scrap aluminum can also be used as the aluminum feedstock 12, such as electrical conducting wire. In an example, the aluminum feedstock 12 can have less than 20 ppmw metal and alkali impurities. The aluminum feedstock 12 can be in the form of ingots, sows, or chunks.

The surfaces of the aluminum feedstock 12 can optionally be washed 14 to provide a washed aluminum 16. The surfaces of the aluminum feedstock 12 can be washed 14 by treating the surfaces with an acid, base, soap, solvent, or alcohol. The treated surfaces can then be rinsed with high purity water, e.g., water that has been purified by one or any combination of deionization, filtration, reverse osmosis, and distillation. In an example, the water can have a purity of at least about 99.999 wt. % pure water. The water can have less than about 0.5 ppmw total impurities, such as less than about 0.2 ppmw total impurities. In an example, the surfaces of the aluminum feedstock are cleaned by reacting the surfaces of the aluminum feedstock 12 with hydrochloric acid (HCl).

The washed aluminum 16 can be reacted 18 with one or more acids 20. The acid can have a high purity, such as an acid having less than 1 ppmw impurities for all elements. In an example, the acid can comprise less than about 1 ppmw of Na, Ca, Li, Fe, Zn, Cu, Ti, Cr, K, and Mg. The one or more acids 20 can also be industrial-grade acids, such as industrial grade HCl, which has been purified via one or more of filtration, an ion-exchange process, distillation, and a diffusion dialysis process.

Water 22 can be used to dilute the acid to a desired concentration before or during the reaction 18. The one or more acids 20 and the water 22 can be added to the reaction 18 as the aluminum 16 is being leached. The water can have a high purity, such water that has been purified by one or any combination of deionization, filtration, reverse osmosis, or distillation. In an example, the water can have a purity of at least about 99.999 wt. % pure water. The water can have less than about 0.5 ppmw total impurities, such as less than about 0.2 ppmw total impurities The one or more acids acid 20 can include, but are not limited to, one or any combination of sulfuric acid ($H_2SO_4$), nitric acid ($HNO_3$), phosphoric acid ($H_3PO_4$), hydrochloric acid (HCl), and hydrofluoric acid (HF).

The reaction 18 of the one or more acids 20 and the aluminum 16 in the water 22 can result in the formation of a hydrated aluminum salt solution 24. The reaction 18 of the one or more acids 20 and the aluminum 16 can be referred to as leaching the aluminum 16. The aluminum 16 can be dissolved in the acid 20 to form the hydrated aluminum salt 24. The one or more acids 20 and the water 22 can be added in a sufficient amount so that substantially all the hydrated aluminum salt 24 can be dissolved in the liquid. Additional water having a high purity can be added in the form of a diluted high purity acid or straight high purity water.

In the example where the acid 20 comprises HCl, the hydrated aluminum salt 24 can comprise hydrated aluminum chlorohydrate, also referred to as polyaluminum chloride, which is a group of aluminum salts having the general formula $Al_nCl_{(3n-m)}/(OH)_m$.

The reaction can be run until all or substantially all of the available hydrogen from the acid 20 is released as hydrogen gas ($H_2$). The hydrated aluminum salt 24, such as polyaluminum chloride, that is formed by the reaction 18 can have a density of from about 1.26 grams/cm$^3$ ("g/cc") and about 1.36 g/cc once all the acid 20 has been reacted. The reaction 18 can take from about 6 hours to about 72 hours for all the acid 20 to be reacted to form the hydrated aluminum salt 24.

The reaction 18 can be performed in high-temperature stable and acid resistant reaction vessel, such as a tank, with ventilation for $H_2$ gas formed during the reaction (not shown). In an example, the reaction vessel can comprise a high-temperature resistant plastic that will be thermally stable at temperatures of at least 25° C. to about 100° C. The reaction vessel can comprise a non-contaminating material that can resist the chemical conditions of the reaction 18 without contaminating the process with additional impurities, also referred to herein as a "non-contaminating material," a "non-contaminating tank" or a "non-contaminating vessel." In an example, the reaction vessel can hold from about 400 L to about 4000 L. Examples of potential reaction vessel materials include, but are not limited to, are polyvinylidene difluoride (PVDF), sold under the trade name KYNAR; polytetrafluoroethylene (PTFE), sold under the trade name TEFLON; fluorinated ethylene propylene (FEP), sold under the trade name TEFLON FEP; perfluoroalkoxy (PFA), sold under the trade name TEFLON PFA; polypropolyene (PP); Polyethylene (PE); VITON; or other high temperature plastics or rubbers that can resist the temperature and chemical attack. The reaction vessel can also comprise a non-chemical resistant base material having a fluorinated coatings, such as a PTFE coating or a PFA coating, or both, an acid-resistant epoxy coating, a rubber coating, or a high-temperature plastic coating, such as one of the materials described above.

The reaction vessel can be insulated on some or all sides, including a top and a bottom. The reaction vessel can be a closed vessel, or the reaction vessel can comprise a lid that vents to a scrubber or an exhaust. Exhaust fumes from the reaction 18 can go to one or any combination of a scrubber, a condenser, or other device for recycling of the water and acid. The exhaust fumes can be refluxed. The reaction vessel can be vented with air to dilute hydrogen level below a lower explosion limit.

The reaction 18 can be limited by the amount of the one or more acids 20 added to the reaction vessel. The one or more acids 20 can be added all at once, metered into the reaction vessel over time, or added at the beginning of the reaction 18 and then further metered in over time. At least a stoichiometric amount of the aluminum 16 can be added to the reaction vessel for the reaction 18, but excess aluminum 16 can also be added to the reaction vessel. Excess, unreacted aluminum can be left in the reaction vessel for a subsequent next batch. In an example, a constant or substantially constant surface area of the aluminum can be used in the reaction vessel from batch to batch, so that aluminum can be added after each batch to replace the aluminum that was reacted in a previous batch. The water 22 and the aluminum 16 can be added to the reaction vessel first followed by metering the one or more acids 20 into the reaction vessel.

The liquid in the reaction vessel can be heated to a temperature of from about 25° C. to about 130° C. The vessel can be heated using external heat and/or the heat from the exothermic reaction in the vessel. The vessel can be heated using a heat exchanger in the tank, coated heating elements, or hot fluid pumped through coils resistant to the temperature at which the reaction 18 is run and the chemicals present in the reaction vessel. The aluminum salt solution and the aluminum salt crystals can be made in the same reaction vessel.

The liquid in the reaction vessel can be mixed during the reaction 18, for example by rotary stirring of the contents of the reaction vessel, pumping the liquid around the reaction vessel, or another method.

Alternatively, as a preliminary step, the aluminum 16 can be dissolved in a high-purity base, such as NaOH (not shown). In an example, the base can have a purity of 99% or higher. The resulting liquid can be filtered to remove impurities, then the pH of the filtered liquid can be reduced by adding an acid, CO gas, or $CO_2$ gas to the liquid. In the example of NaOH as the base, aluminum trihydrate ($Al(OH)_3$) can precipitate out of the liquid. The liquid can be filtered and washed in high purity water to remove the aluminum trihydrate, then the aluminum trihydrate can be reacted with an acid to form a hydrated aluminum salt that can be used to feed the remainder of the process 10.

When the reaction 18 occurs with some grades of aluminum, small particles can be seen in the liquid that includes the hydrated aluminum salt 24. These small particles can typically be impurities that have not dissolved in the acid mixture. For example, if iron impurities are present in the aluminum feedstock 12 and HCl is used as the acid 20, iron(III) chloride ($FeCl_3$) can form as small black particles in the reaction liquid. The lower the purity of aluminum feedstock 12, the more of these small particles that will be seen in the reaction vessel. Some of the particles will dissolve over time, reducing the purity of the hydrated aluminum salt 24, and thus reducing the final purity of the aluminum oxide. Therefore, the hydrated aluminum salt 24 can optionally be filtered 26 to remove the impurity particles from the liquid to form a filtered hydrated aluminum salt solution 28. The filtration 26 can take place in conjunction with the reaction 18 or downstream of the reaction 18. In an example, the liquid can be continuously filtered while the reaction 18 is progressing to remove the impurity particles.

In an example, at least one of magnetic separation, acid resistant filters, an ion-exchange resin, one or more centrifuges, one or more filter bags, one or more filter cartridges, and settling can be used to accomplish the filtration 26. Other processes for filtering or separating out small particles know in the art can also be used for the filtration 26. The filters can be configured to remove particles having a size of about 1 micrometer (μm) or larger, such as to remove particles having a size of about 0.1 μm or larger, for example to remove particles having as size of 0.01 μm or larger. In an example, a series of filters each configured to filter out different particles sizes can be used. Alternative to filtering, or in addition to filtering, the impurity particles can be removed with one or more solvents that can dissolve the particles, but that are not miscible in water so that the solvent with dissolved impurity can be easily removed from the reaction liquid, which is water-based.

In some examples, the aluminum feedstock 12 can be of sufficiently high purity such that filtering or removal of impurity particles the hydrated aluminum salt 24 is not necessary to achieve acceptable final purity of the aluminum oxide.

The hydrated aluminum salt solution 24 formed in the reaction 18, or the filtered hydrated aluminum salt solution 28 (if filtration 26 is performed) can be precipitated from the solution 24, 28 to provide a mixture solid hydrated aluminum salt crystals and a mother liquor 30. In an example, precipitation to solid hydrated aluminum salt crystals can be accomplished by heating 32 the solution 24, 28 in order to evaporate water and other liquids. By removing water, gases, and other liquids from the hydrated aluminum salt solution 24, 28, the concentration of the hydrated aluminum salt in the solution 24, 28 can increase and can eventually become saturated so that solid hydrated aluminum salt crystals precipitate out of the solution 24, 28. In an example, the hydrated aluminum salt solution 24, 28 to the hydrated aluminum salt solution 24, 28 can be heated at a temperature of from about 100° C. to about 140° C. Some acids or acid combinations 20 can require a higher temperature during heating 32 in order to evaporate a sufficient amount of water from the solution 24, 28. In an example, the hydrated aluminum salt solution 24, 28 can be heated from about 12 hours to about 72 hours. The hydrated aluminum salt solution 24, 28 can be heated until from about 70% to about 99.9% of the liquid has been evaporated. Alternatively the majority of the liquid can be evaporated and then a small percentage of water, such as high-purity water, can be added back into the salt to create some mother liquor.

In an example, the heating 32 to precipitate out the aluminum salt crystals into the aluminum salt crystals and mother liquor mixture 30 can be performed in a heating vessel comprising materials that will not add contamination to the process, also referred to as a non-contaminating heating vessel or as non-contaminating material. In an example, the heating vessel can comprise at least one of a high-temperature plastic such as PTFE, FEP, PFA, PVDF, and VITON; alumina; glass; quartz; or other high temperature plastics or ceramics that can withstand the temperature of the heating step 32 and chemical attack by the salts, liquid, and vapor present in the heating vessel. The heating vessel can also be made of another material that is coated with PTFE, FEP, PFA, PVDF, VITON, alumina, glass, quartz, or another high-temperature plastic or ceramic that can withstand the temperature and chemicals of the heating vessel.

Examples of methods to heat the solution 24, 28 in the heating vessel can include, but are not limited to, at least one of heating in a furnace, with a heat exchanger coil, with an immersion heater, with a hot oil heater, with PTFE heat exchanger coils in the solution 24, 28, by injecting high purity steam with a boiler, and with external heat. The vessel can have a lid with a vent.

In an example, the heating vessel can hold at least about 400 L, such as at least about 4000 L, of the hydrated aluminum salt solution 24, 28. The heating vessel can comprise a draft so that the aluminum salt crystals and mother liquor mixture 30 can be easily removed from the heating vessel. Any resulting gases from the heating 32 can be recycled to recover water and acid. The water and acid vapor can be collected in a condenser or scrubber. The condensed vapor can be recycled and reused in the process. The condensed liquid can be purified before recycling. In an example, the condensed vapor can be used to make lower quality alumina.

In an example, the heating 32 to provide the aluminum salt crystals and the mother liquor mixture 30 can be performed in a container or vessel under vacuum, e.g., with the pressure within the heating vessel being less than atmospheric pressure. The application of a vacuum to the heating vessel can increase the rate at which steam and other vapors are removed from the vessel, which, in turn, can increase the rate and extent of precipitation of aluminum salt crystals into the mixture of the aluminum salt crystals and mother liquor mixture 30. The application of the vacuum to the heating vessel has been found to speed up the rate of evaporation and lower the required reaction temperature.

In an example, the vacuum can be provided with a blower capable of applying a vacuum pressure to the vessel. In an example, a blower rated for at least about 5 inches of water (about 0.012 bar) can be used to provide the vacuum pressure. In an example, the vacuum pressure within the vessel (e.g., the pressure below atmospheric pressure) can be at least 0.005 bar vacuum, such as at least about 0.01 bar vacuum, for example at least about 0.015 bar vacuum, such as at least about 0.02 bar vacuum, at least about 0.03 bar vacuum, at least about 0.04 bar vacuum, at least about 0.05 bar vacuum, at least about 0.1 bar vacuum, at least about 0.15 bar vacuum, at least about 0.2 bar vacuum, or at least about 0.25 bar vacuum.

Alternatively, or in conjunction with, the heating 32, HCl gas, high-purity HCl acid solution, or another acid solution, such as $H_2SO_4$, can be injected into the hydrated aluminum salt solution 24, 28 in order to lower the solubility of the hydrated aluminum salts in the hydrated aluminum salt solution 24, 28 in order to cause the salts to precipitate. In an example, a 38% HCl solution having a high purity can be added to the hydrated aluminum salt solution 24, 28 in order to precipitate out aluminum salt crystals to provide the solid hydrated aluminum salt crystals and the mother liquor mixture 30.

The hydrated aluminum salt crystals and mother liquor mixture 30 can optionally be washed (not shown in the process of FIG. 1), such as with an acid, a solvent, or a polyaluminum chloride solution, for example a high-purity acid. In an example, the wash acid can comprise a high-purity HCl having a concentration of from about 28 wt. % to about 38 wt. %. The hydrated aluminum salt crystals and mother liquor mixture 30 can optionally be washed (not shown in the process of FIG. 1), with an acid, a solvent, water, or a polyaluminum chloride solution. In an example high purity acetone can be used to wash the aluminum salt crystals.

The hydrated aluminum salt crystals and mother liquor mixture 30 can be separated 34 to form separated hydrated aluminum salt crystals 36 and the mother liquor 38. The separation 34 can include, but is not limited to, settling, filtering, or centrifuging the hydrated aluminum salt crystals and mother liquor mixture 30. The separation 34 can be performed in one or more non-contaminating separation vessels, which can comprise one of the non-contaminating materials described above with respect to the reaction vessel and the heating vessel. The separation 34 can be done at room temperature or at any temperature up to the evaporation temperature of the process. The hydrated aluminum salt crystals and mother liquor mixture 30 can be allowed to cool to room temperature before separation 34. The hydrated aluminum salt crystals and mother liquor mixture 30 also can be slowly cooled to room temperature before separation 34. In an example, the separation vessel can comprise a container, such as a high-temperature, acid-resistant plastic container, comprising an acid-resistant filter or a plurality of holes in the container, such as in the bottom and sides of the container, that can allow the mother liquor 38 to drain out of the container and away from the hydrated aluminum salt crystals 36.

The separated hydrated aluminum salt crystals 36 can be washed with a washing liquid. In an example, the washing liquid can comprise at least one of a high-purity acid, such as HCl, high-purity acetone or another solvent, a high-purity solution of the hydrated aluminum salt (e.g., if the crystals 36 are polyaluminum chloride, then a polyaluminum chloride solution can be used as the washing liquid), and high-purity water. In an example, an acid washing liquid (e.g., high-purity HCl) is used with a concentration that is sufficiently high so that a substantial portion of the hydrated aluminum salt crystals 36 do not dissolve back into solution. The washing of the hydrated aluminum salt crystals 36 can also be sufficiently rapid so that a substantial portion of the hydrated aluminum salt crystals 36 do not dissolve. The aluminum salt crystals 36 can be washed with high-purity water or a weaker acid so long as the water or weak acid is rinsed off fairly quickly to prevent anything more than minimal dissolving of the aluminum salt crystals 36. The washing liquid can be purified and reused in the process.

The separated hydrated aluminum salt crystals 36 can optionally be dissolved 40 in high purity water and recycled 42 back to the hydrated aluminum salt solution 24 to be further filtered 26, if desired, and reheated 32 to precipitate out the hydrated aluminum salt crystals into the mixture of the aluminum salt crystals and mother liquor 30. Recycling 42 of the hydrated aluminum salt crystals 36 can be repeated one or more times. Each recycling 42 of the hydrated aluminum salt crystals 36 can be performed with different acids or combinations of acids. Some acids that could be used include, but are not limited to, HCl, $H_2SO_4$, $H_2PO_4$, and $HNO_3$. In an example, the recycling 42 can include crystallizing the hydrated aluminum salt two times, three times, four times, five times, or more. After forming the hydrated aluminum salt crystals 36, and if desired recycling 42 the hydrated aluminum salt crystals 36 to recrystallize the hydrated aluminum salt, the hydrated aluminum salt crystals 36 can be milled, grinded, or tumbled so that the crystals 36 can have a smaller size for later in the process.

After the optional recycling 42, the hydrated aluminum salt crystals 36 can be heated 44 to convert the hydrated aluminum salt crystals 36 to aluminum oxide 46 (also referred to as alumina 46), also referred to as calcining the aluminum salt to form alumina 46. In an example, the alumina 46 can comprise alpha aluminum oxide. The temperature to which the hydrated aluminum salt crystals 36 are heated can be sufficiently high to drive off the hydrated water of the hydrated aluminum salt crystals 36 and the other components of the hydrated aluminum salt crystals 36, e.g., the chloride from the aluminum chlorohydrate if HCl is used as the one or more acids 20. The heating 44 can also be at a temperature that is sufficiently high to convert the hydrated aluminum salt crystals 36 to alumina 46, such as an alumina powder 46. The hydrated aluminum salt crystals 36 can be heated 44 to a temperature of from about 700° C. to about 1650° C. In an example, the hydrated aluminum salt crystals 36 can be heated 44 at a temperature of at least 1150° C., such as at least about 1450° C., for example at least about 1500° C., such as at least about 1600° C.

The heating 44 to convert the aluminum salt crystals 36 to alumina 46 can be performed in a crucible comprising a material that is thermally stable at the high temperatures necessary to calcine the hydrated aluminum salt crystals 36. Examples of materials that can form the crucible include, but are not limited to, aluminum oxide ($Al_2O_3$), silicon (Si), silicon carbide (SiC), tantalum (Ta), quartz, and mullite. In an example, the crucible comprises aluminum oxide. In an example, the crucible comprises a material that does not react or otherwise add contaminating impurities to the process fluid, also referred to as a non-contaminating material or a non-contaminating container. The crucible can be the lining of a calcination furnace. The calcination furnace can comprise one or any combination of a shaft furnace, a rotary kiln, one or more hearth furnaces, a resistance furnace, or a fluidized bed reactor. The calcination can be done in a furnace with an air, argon, or nitrogen atmosphere. The crucible can have a lid with a vent out of the calcination furnace. The hydrated aluminum salt crystals 36 can convert to high purity $Al_2O_3$ as it is heated up. The heating 44 can be done in one furnace with one crucible, or the heating 44 can be done in two different crucibles in two different furnaces.

In an example, hydrated aluminum salt crystals 36 can be heated up to an initial temperature of from about 200° C. to about 700° C. to remove the majority of the $H_2O$, HCl, $Cl_2$ (e.g., if HCl was used as the acid to form aluminum chlorohydrate as the aluminum salt crystals 36). In such an example, the aluminum chlorohydrate can convert to partially calcined aluminum oxyhydrate (AlO(OH)). The partially calcinated aluminum oxyhydrate can be rinsed with water or dilute acids to remove alkali metal chlorides and magnesium chlorides. The partially calcinated aluminum oxyhydrate can be rinsed with high purity water multiple times. The partially calcinated aluminum oxyhydrate can be tumbled, milled or grinded, before or after washing.

The HCl and $Cl_2$ gases produced during heating 44 can be recycled by being passed through water, a scrubber, or a condenser to make hydrochloric acid or other acids.

Prior to heating 44 the hydrated aluminum salt crystals 36 to calcine the hydrated aluminum salt, the crystals 36 can be heated to drive off any liquid before loading the crystals 36 into the calcinations furnace, such as by heating the crystals 36 to a temperature of from about 150° C. to about 270° C.

The alumina 46 can optionally be further processed 48, such as by milling, crushing, or tumbling the alumina 46 to provide an alumina powder 50 having a desired size profile. In an example, the alumina powder 50 can have an average powder size of about 0.010 mm and a size distribution from about 0.00012 mm to about 0.011 mm.

The alumina powder 46, 50 can be separated with a magnet to remove impurities. The alumina powder 46, 50 can be separated by sieving or a fluid bed reactor to separate out particles and impurities.

The alumina powder 46, 50 can be washed 52 to provide a washed alumina powder 54. The alumina powder 46, 50 can be washed 52 with $H_2O$ or an acid, or a combination, such as a weak HCl acid. The water or acid used to wash the alumina powder 46, 50 can be a high-purity water or high-purity acid. The washing step 52 can be repeated multiple times as desired to remove any residue from the alumina powder 46, 50. After washing 52, the alumina powder 46, 50 can be rinsed with water to provide the washed alumina powder 54.

The resulting washed alumina powder 54 can have a high purity of at least about 99.997%, such as at least about 99.999%, for example at least about 99.99% (about 4N). In an example, the alumina powder 54 can comprise less than about 30 parts per million weight (ppmw) total metallic and alkyl impurities. In an example, the alumina powder 54 can comprise less than 5 ppmw total metallic and alkyl impurities. In an example, the alumina powder 54 can have a sodium (Na) content of less than 10 ppmw, such as less than about 5 ppmw Na, such as less than about 1 ppmw Na. In an example, the alumina powder 54 can have an iron (Fe) content of less than 5 ppmw. In an example, the alumina powder 54 can have a silicon (Si) content of less than 10 ppmw, such as less than about 5 ppmw Si, such as less than about 2 ppmw Si. In an example, the alumina powder 54 can have a titanium (Ti) content of less than 1 ppmw, such as less than about 0.2 ppmw Ti. In an example, the alumina powder 54 can have a magnesium (Mg) content of less than about 5 ppmw, such as less than about 2 ppmw Mg. In an example, the alumina powder 54 can have a calcium (Ca) content of less than 5 ppmw, such as less than about 2 ppmw Ca. In an example, the alumina powder 54 can have a potassium (K) content of less than about 5 ppmw. In an example, the alumina powder 54 can have a copper (Cu) content of less than about 1 ppmw. In an example, alumina powder 54 can have a chromium (Cr) content of less than about 1 ppmw.

After washing 52, the washed alumina powder 54 can be converted to sapphire 56 by melting 58 the alumina powder 54. The alumina powder 54 can be compressed using cold isostatic pressing (CIP) or hot isostatic pressing (HIP). The alumina powder 54 can be compressed and sintered. The alumina powder can be converted into crackle with the Verneuil process. The powder can be used to make sapphire used to make sapphire cover glass for mobile electronic devices.

EXAMPLES

The embodiments of the present invention can be better understood by reference to the following examples which are offered by way of illustration. The present invention is not limited to the example given herein.

Example 1

656 g of 99.99+% aluminum was provided. The aluminum included the following composition: 14.1 ppmw Si, 17.1 ppmw Fe, 0.04 ppmw Mn, 0.14 ppmw Mg, 27.8 ppmw Cu, 0.14 ppmw Ti, 0.29 ppmw Zn, 0.02 ppmw Cr, 0.24 ppmw V, 0.23 ppmw Ga, and the remainder Al. The aluminum was added to 300 g distilled water and 150 g of reagent grade HCl. The distilled water was less than 0.5 mg/L Si, less than 1 mg/L Na, less than 1 mg/L K, less than 1 mg/l Ca, less than 1 mg/L Mg, less than 0.5 mg/L Al, less than 0.1 mg/L Fe, less than 0.1 mg/L P, and less than 0.5 mg/L Cl. The reagent grade HCl was less than 1 ppmw $SO_4$, less than 1 ppmw $SO_3$, less than 1 ppmw free Cl, less than 3 ppmw $NH_4$, less than 0.01 ppmw As, less than 1 ppmw heavy metals, less than 0.2 ppmw Fe, and less than 5 ppmw extractable organic substances.

The liquid mixture of the aluminum, the water, and the HCl was heated to above 65° C. in a high-density polyethylene (HDPE) container for 24 hours. After heating, another 150 g of the reagent grade HCl was added and the new mixture was allowed to stand for another 24 hours. It was determined that 31 grams of the aluminum was dissolved in the liquid. The liquid was then drained from the reaction tank and filtered with a 1 μm polypropylene filter.

The filtered liquid was next heated in a high temperature plastic container to 130° C. for 6 hours and allowed to cool back to room temperature. An additional 150 g of the reagent grade HCl was added to the aluminum salt crystals and the mother liquor in the container. The mixture was allowed to settle and the majority of the liquid was poured off the top of the container. The remaining material was then filtered through a 10 μm polypropylene filter and the aluminum salt crystals were collected off the filter.

The aluminum salt crystals were put back in the high temperature plastic container and high purity water was added to fill the container. The aluminum salt crystals were stirred to help them dissolve in the water. The process steps of heating the liquid to provide aluminum salt crystals and mother liquor was repeated and the mother liquor and HCl was poured off, filtered, and the crystals were rinsed with high purity HCl.

The remaining aluminum salt crystals were heated for 4 hours at 200° C. in a polytetrafluoroethylene (PTFE) crucible. The crystals were then transferred to a high-purity aluminum oxide crucible and heated up at a rate of 125° C. per hour until the crucible reached a temperature of 1200° C. and held for 2 hours. The crucible was then cool at the same rate back to room temperature. The resulting powder had the following chemistry as determined by glow discharge mass spectrometry (GDMS): 5.8 ppmw Na, 5.3 ppmw Mg, 4.4 ppmw Si, 0.16 ppmw Ti, 0.1 ppmw V, 1.5 ppmw Cr, 5.3 ppmw Fe, 6.9 ppmw, and the remainder aluminum oxide. The high-purity aluminum oxide powder weight was 42 g.

Example 2

247 g of 99.99+% aluminum was provided having the following composition: 7.5 ppmw Si, 3.9 ppmw Fe, 0.05 ppmw Mn, 2.7 ppmw Mg, 2.7 ppmw Cu, 0.07 ppmw Ti, 1.5 ppmw Zn, 0.02 ppmw Cr, 0.13 ppmw V, 0.15 ppmw Ga, and the remainder Al. The aluminum was added to 900 g of water that had been treated with reverse osmosis and has been distilled. The water and aluminum was heated to above 85° C. in a polypropylene container and 999 g of reagent grade HCl having a concentration of 36% was added to the container. The aluminum, water, and HCl were allowed to sit for over 48 hours. The container was vented to a condenser and then to atmosphere. It was determined that 102 g of the aluminum was dissolved in the liquid.

The liquid was then drained from the container and was filtered with a 1 μm polypropylene filter. The resulting liquid was 1865 g of poly aluminum chloride (PAC) having a specific gravity of 1.28 g/cm$^3$. The PAC liquid was heated in a high temperature resistant polyvinylidene difluoride (PVDF) container to 125° C. for 24 hours and allowed to cool back to room temperature over 12 hours. The container was allowed to vent to a condenser.

The mixture was allowed to settle in a plastic container with 1.0 mm holes in the bottom and sides to allow mother liquor to drain from the container. The majority of the mother liquor drained out of the container through the holes. The remaining aluminum salt crystals were then heated up at a rate of 180° C. per hour to 1250° C. in an aluminum oxide crucible. The fumes from the crucible were vented to a condenser and then to a scrubber. The resulting powder in the crucible was tumbled in high-purity water for 12 hours after calcination. The resulting powder had the following chemistry as reported by GDMS: 5.8 ppmw Na, 3.4 ppmw Mg, 3.7 ppmw Si, 0.63 ppmw Ti, 0.29 ppmw V, less than 0.5 ppmw Cr, 2.6 ppmw Fe, and the remainder aluminum oxide. The high purity aluminum oxide powder weight was 163 g.

Example 3

30.5 kg of 99.99+% aluminum was provided having the following composition: 7.5 ppmw Si, 3.9 ppmw Fe, 0.05 ppmw Mn, 2.7 ppmw Mg, 2.7 ppmw Cu, 0.07 ppmw Ti, 1.5 ppmw Zn, 0.02 ppmw Cr, 0.13 ppmw V, 0.15 ppmw Ga, and the remainder Al. The aluminum was added to 80 L of water that had been treated with reverse osmosis and distilled. The surface of the aluminum was cleaned with HCl before addition to the water. The water and aluminum was heated to above 80° C. in a polypropylene container. After heating, 120 L of HCl having a concentration of 38% was added to the container. The HCl had less than 1 ppmw of each of Fe, Na, Si, Ca, Mg, and Zn. The mixture of the aluminum, water, and HCl is allowed to sit for over 92 hours. The container was vented to a condenser and then to atmosphere. The condensed liquid was recycled and reused in future batches.

It was determined that 16 kg of the aluminum was dissolved in the water and HCl mixture to form a polyaluminum chloride (PAC) solution. The solution was then drained from the reaction tank and was filtered with a 0.5 μm polypropylene filter. 213 kg of PAC solution was made at a specific gravity of 1.28 g/cm$^3$. Next the PAC solution was heated in a high temperature polyvinylidene difluoride (PVDF) container to 125° C. for 92 hours and allowed to cool back to room temperature over 12 hours. The container was vented to a condenser, using a blower with 5 inch water column static pressure. The heated mixture was allowed to settle in a plastic container with 1.0 mm holes in the bottom and sides. The majority of the mother liquor drained out of the container through the holes. The remaining aluminum salt crystals were then heated at a rate of 180° C. per hour to a temperature of 1250° C. in an alumina crucible to form an aluminum oxide power. The fumes from the crucible were vented to a condenser and then to a scrubber. The liquid in the scrubber and condenser was recycled and reused in the process in future batches.

The resulting aluminum oxide powder has a mass of 25.2 kg. The powder was tumbled with media in a tumbler for 8 hours with high-purity water. Then the mixture was left to settle for 16 hours. Next the water was poured off of the top of the powder and more high-purity water was added. The container was shaken and allowed to settle for 24 hours. The powder was rinsed 4 times. The alumina powder met the standard high-purity alumina specifications with each of Fe, Si, Na, Ca, Mg, Zn, Cu, and K being less than 5 ppmw, and all metal and alkali elements being less than 5 ppmw each.

EMBODIMENTS

To better illustrate the method and apparatuses disclosed herein, a non-limiting list of embodiments is provided here:

EMBODIMENT 1 can include subject matter (such as an apparatus, a device, a method, or one or more means for performing acts), such as can include a process comprising:
    a) reacting an acid or combination of acids with aluminum in water to provide a solution;
    b) optionally filtering the solution;
    c) heating the solution or injecting an acid gas into the solution to provide aluminum salts and a mother liquor;
    d) separating the mother liquor from the aluminum salt crystals;
    e) optionally adding high purity water to the aluminum salt crystals and repeating steps b), c) and d); and
    f) heating the aluminum salt crystals to convert the aluminum salt crystals to alpha alumina.

EMBODIMENT 2 can include, or can optionally be combined with, the subject matter of EMBODIMENT 1, and can include subject matter (such as an apparatus, a device, a method, or one or more means for performing acts), such as can include a high purity aluminum oxide produced by:
    a) reacting an HCl acid with aluminum in water to provide a solution;
    b) heating the solution to provide aluminum salt crystals and a mother liquor;
    c) separating the mother liquor from the aluminum salt crystals; and
    d) heating the aluminum salt crystals to convert the aluminum salt crystals to alumina.

EMBODIMENT 3 can include, or can optionally be combined with, the subject matter of one or any combination of EMBODIMENTS 1 and 2, and can include subject matter (such as an apparatus, a device, a method, or one or more means for performing acts), such as can include a batch process for producing high-purity aluminum oxide, the batch process comprising:
    a) in a plastic or plastic coated reaction vessel, reacting an acid or combination of acids with aluminum in water to provide a solution;
    b) optionally filtering the solution;
    c) in a plastic or plastic coated container, heating the solution or injecting an acid gas into the solution to provide aluminum salt crystals and a mother liquor;

d) separating the mother liquor from the aluminum salt crystals;
e) optionally adding water to the aluminum salt crystals and repeating steps b), c) and d);
f) in a plastic container, heating the aluminum salt crystals to 140-200° C. to provide a powder;
g) heating the powder to 1000-1200° C. in an aluminum oxide crucible to provide an aluminum oxide powder.

EMBODIMENT 4 can include, or can optionally be combined with, the subject matter of one or any combination of EMBODIMENTS 1-3, and can include subject matter (such as an apparatus, a device, a method, or one or more means for performing acts), such as can include a batch process for producing high-purity aluminum oxide, the batch process comprising:
a) reacting an acid or combination of acids with aluminum in water in a plastic or plastic coated reaction vessel to provide a solution;
b) optionally filtering the solution;
c) in a plastic or plastic coated container, heating the solution or injecting an acid gas into the solution to provide aluminum salt crystals and a mother liquor;
d) separating the mother liquor from the aluminum salt crystals;
e) optionally adding water to the aluminum salt crystals and repeating steps b), c) and d); and
f) heating the aluminum salt crystals to 1000-1200° C. in an aluminum oxide crucible to convert the aluminum salt crystals to aluminum oxide.

EMBODIMENT 5 can include, or can optionally be combined with, the subject matter of one or any combination of EMBODIMENTS 1-4, and can include subject matter (such as an apparatus, a device, a method, or one or more means for performing acts), such as can include a high-purity aluminum oxide produced by:
a) reacting an acid or a combination of acids with aluminum in water to provide a solution;
b) optionally filtering the solution;
c) heating the solution or injecting an acid gas into the solution to provide aluminum salt crystals and a mother liquor in a plastic container;
d) separating the mother liquor from the aluminum salt crystals;
e) optionally adding water to the aluminum salt crystals and repeating steps b), c) and d);
f) heating the aluminum salt crystals to convert the aluminum salt crystals to alpha alumina; and
g) melting the alpha alumina.

EMBODIMENT 6 can include, or can optionally be combined with, the subject matter of one or any combination of EMBODIMENTS 1-5, and can include subject matter (such as an apparatus, a device, a method, or one or more means for performing acts), such as can include a process for manufacturing high purity aluminum oxide, the process comprising:
a) in a heated, non-contaminating vessel, reacting water and acid with aluminum to provide a solution, wherein the aluminum is employed in molar excess, relative to the acid;
b) optionally filtering the solution to remove impurities;
c) in a non-contaminating container, heating the liquid or inject acid gas to provide aluminum salt crystals and mother liquor;
d) separating the mother liquor from the aluminum salt crystals;
e) optionally washing the aluminum salt crystals with acid or water;
f) optionally adding water to the aluminum salt crystals and repeating steps b), c), d), and e) one or more times; and
g) in a non-contaminating container, heating the aluminum salt crystals to convert the aluminum salt crystals to alpha alumina.

EMBODIMENT 7 can include, or can optionally be combined with, the subject matter of one or any combination of EMBODIMENTS 1-6, and can include subject matter (such as an apparatus, a device, a method, or one or more means for performing acts), such as can include a batch process for manufacturing high-purity aluminum oxide with less than 30 ppmw metallic and alkali impurities, the batch process comprising:
a) in a non-contaminating vessel heated above 25° C., reacting water and acid with aluminum to provide a solution, wherein the aluminum is in at least a molar equivalent relative to the acid;
b) optionally filtering the solution to remove impurities;
c) heating the solution or inject an acid gas into the solution to provide aluminum salt crystals and a mother liquor;
d) separating the mother liquor from the aluminum salt crystals;
e) optionally washing the aluminum salt crystals with acid or water;
f) optionally adding water to the aluminum salt crystals and repeating steps b), c), d) and e) one or more times;
g) heating the aluminum salt crystals to convert the aluminum salt crystals to alpha alumina; and
h) optionally melting the alpha alumina to convert the alpha alumina into sapphire.

EMBODIMENT 8 can include, or can optionally be combined with, the subject matter of one or any combination of EMBODIMENTS 1-7, and can include subject matter (such as an apparatus, a device, a method, or one or more means for performing acts), such as can include a method comprising:
(a) contacting an acid, aluminum, and water to form a first solution;
(b) at least one of heating and gas injecting the first solution, to provide a mother liquor and solid aluminum salts;
(c) separating the solid aluminum salts from the mother liquor;
(d) heating the solid aluminum salts, to provide aluminum oxide; and
(e) washing the aluminum oxide.

EMBODIMENT 9 can include, or can optionally be combined with, the subject matter of one or any combination of EMBODIMENTS 1-8, and can include subject matter (such as an apparatus, a device, a method, or one or more means for performing acts), such as can include a method comprising:
(a) in a heated non-contaminating vessel, contacting high-purity acid, high-purity aluminum, and high-purity water to form a first solution, wherein the aluminum is employed in at least a stoichiometric amount relative to the acid;
(b) in a non-contaminating container, heating the first solution, to provide a mother liquor and solid aluminum salts;
(c) separating the solid aluminum salts from the mother liquor;
(d) in a non-contaminating crucible, heating the solid aluminum salts, to provide alpha aluminum oxide;

(e) optionally washing the alpha aluminum oxide with high-purity water after some or all of the heating of step (d).

EMBODIMENT 10 can include, or can optionally be combined with, the subject matter of one or any combination of EMBODIMENTS 1-9, to optionally include the alumina being used to manufacture one or more of LED grade sapphire ingots, LED substrates, and mobile device cover windows.

EMBODIMENT 11 can include, or can optionally be combined with, the subject matter of one or any combination of EMBODIMENTS 1-10, to optionally include the acid comprising one or any combination of HCl, $H_2SO_4$, $HNO_3$, and $H_3PO_4$.

EMBODIMENT 12 can include, or can optionally be combined with, the subject matter of one or any combination of EMBODIMENTS 1-11, to optionally include the acid being a high-purity acid.

EMBODIMENT 13 can include, or can optionally be combined with, the subject matter of one or any combination of EMBODIMENTS 1-12, to optionally include the acid having less than 1 ppmw metallic impurities.

EMBODIMENT 14 can include, or can optionally be combined with, the subject matter of one or any combination of EMBODIMENTS 1-13, to optionally include the acid comprising less than about 1 ppmw of Na, Ca, Li, Fe, Zn, Cu, Ti, Cr, K and Mg.

EMBODIMENT 15 can include, or can optionally be combined with, the subject matter of one or any combination of EMBODIMENTS 1-14, to optionally include the acid comprising less than about 0.2 ppmw metallic impurities.

EMBODIMENT 16 can include, or can optionally be combined with, the subject matter of one or any combination of EMBODIMENTS 1-15, to optionally include the water comprising high-purity water.

EMBODIMENT 17 can include, or can optionally be combined with, the subject matter of one or any combination of EMBODIMENTS 1-16, to optionally include the water comprising less than 0.5 ppmw total impurities.

EMBODIMENT 18 can include, or can optionally be combined with, the subject matter of one or any combination of EMBODIMENTS 1-17, to optionally include the water being at least about 99.999 wt. % pure water.

EMBODIMENT 19 can include, or can optionally be combined with, the subject matter of one or any combination of EMBODIMENTS 1-18, to optionally include the water comprising less than about 0.2 ppmw total impurities.

EMBODIMENT 20 can include, or can optionally be combined with, the subject matter of one or any combination of EMBODIMENTS 1-19, to optionally include the water comprises at least one of deionized water, filtered water, and distilled water.

EMBODIMENT 21 can include, or can optionally be combined with, the subject matter of one or any combination of EMBODIMENTS 1-20, to optionally include the acid comprising from 30 wt % to 38 wt % HCl that has been diluted with water to 18% HCl.

EMBODIMENT 22 can include, or can optionally be combined with, the subject matter of one or any combination of EMBODIMENTS 1-21, to optionally include the filtering comprising filtering out particles that are 1 micron or larger.

EMBODIMENT 23 can include, or can optionally be combined with, the subject matter of one or any combination of EMBODIMENTS 1-22, to optionally include the filtering comprising filtering out particles that are 0.1 micron or larger.

EMBODIMENT 24 can include, or can optionally be combined with, the subject matter of one or any combination of EMBODIMENTS 1-23, to optionally include the aluminum having a purity of 99.995% aluminum or greater.

EMBODIMENT 25 can include, or can optionally be combined with, the subject matter of one or any combination of EMBODIMENTS 1-24, to optionally include the aluminum having a purity of 99.98% aluminum or greater.

EMBODIMENT 26 can include, or can optionally be combined with, the subject matter of one or any combination of EMBODIMENTS 1-25, to optionally include the aluminum having less than 0.02% total metallic impurities.

EMBODIMENT 27 can include, or can optionally be combined with, the subject matter of one or any combination of EMBODIMENTS 1-26, to optionally include the aluminum having less than 0.01% metallic impurities for each metallic element.

EMBODIMENT 28 can include, or can optionally be combined with, the subject matter of one or any combination of EMBODIMENTS 1-27, to optionally include at least one of cleaning, washing, and rinsing the aluminum prior to reacting the aluminum with the acid and water.

EMBODIMENT 29 can include, or can optionally be combined with, the subject matter of one or any combination of EMBODIMENTS 1-28, to optionally include at least one of cleaning, washing, and rinsing one or more surfaces of the aluminum prior to reacting the aluminum with the acid and water.

EMBODIMENT 30 can include, or can optionally be combined with, the subject matter of one or any combination of EMBODIMENTS 1-29, to optionally include washing the aluminum with at least one of an acid, a base, soap, a detergent, a surfactant, an alcohol, an organic solvent, and water prior to reacting the aluminum with the acid and water.

EMBODIMENT 31 can include, or can optionally be combined with, the subject matter of one or any combination of EMBODIMENTS 1-30, to optionally include washing one or more surfaces of the aluminum with NaOH prior to reacting the aluminum with the acid and water.

EMBODIMENT 32 can include, or can optionally be combined with, the subject matter of one or any combination of EMBODIMENTS 1-31, to optionally include heating the acid to start the reaction between the acid, water, and the aluminum.

EMBODIMENT 33 can include, or can optionally be combined with, the subject matter of one or any combination of EMBODIMENTS 1-32, to optionally include heating the acid to a temperature of from about 60° C. to about 90° C. to start the reaction between the acid, water, and the aluminum.

EMBODIMENT 34 can include, or can optionally be combined with, the subject matter of one or any combination of EMBODIMENTS 1-33, to optionally include controlling a reaction speed by controlling an amount of acid being added to a reaction vessel to react with the aluminum and water.

EMBODIMENT 35 can include, or can optionally be combined with, the subject matter of one or any combination of EMBODIMENTS 1-34, to optionally include controlling a reaction speed by controlling a rate at which the acid is added to a reaction vessel to react with the aluminum and water.

EMBODIMENT 36 can include, or can optionally be combined with, the subject matter of one or any combination of EMBODIMENTS 1-35, to optionally include the aluminum being employed in at least a molar equivalent, relative to the acid, when the aluminum is reacted with the acid and water.

EMBODIMENT 37 can include, or can optionally be combined with, the subject matter of one or any combination of EMBODIMENTS 1-36, to optionally include the aluminum being employed in molar excess, relative to the acid, when the aluminum is reacted with the acid and water.

EMBODIMENT 38 can include, or can optionally be combined with, the subject matter of one or any combination of EMBODIMENTS 1-37, to optionally include the aluminum is employed in at least a 50% molar excess, relative to the acid, when the aluminum is reacted with the acid and water.

EMBODIMENT 39 can include, or can optionally be combined with, the subject matter of one or any combination of EMBODIMENTS 1-38, to optionally include the aluminum being employed in at least a 100% molar excess, relative to the acid, when the aluminum is reacted with the acid and water.

EMBODIMENT 40 can include, or can optionally be combined with, the subject matter of one or any combination of EMBODIMENTS 1-39, to optionally include the aluminum being employed in at least a 1000% molar excess, relative to the acid, when the aluminum is reacted with the acid and water.

EMBODIMENT 41 can include, or can optionally be combined with, the subject matter of one or any combination of EMBODIMENTS 1-40, to optionally include the aluminum being employed in at least a 2000% molar excess, relative to the acid, when the aluminum is reacted with the acid and water.

EMBODIMENT 42 can include, or can optionally be combined with, the subject matter of one or any combination of EMBODIMENTS 1-41, to optionally include the aluminum having less than 20 ppmw total impurities when the aluminum is reacted with the acid and water.

EMBODIMENT 43 can include, or can optionally be combined with, the subject matter of one or any combination of EMBODIMENTS 1-42, to optionally include the aluminum having less than 10 ppmw total impurities when the aluminum is reacted with the acid and water.

EMBODIMENT 44 can include, or can optionally be combined with, the subject matter of one or any combination of EMBODIMENTS 1-43, to optionally include the aluminum having less than 5 ppmw total impurities when the aluminum is reacted with the acid and water.

EMBODIMENT 45 can include, or can optionally be combined with, the subject matter of one or any combination of EMBODIMENTS 1-44, to optionally include the aluminum having less than 1 ppmw total impurities when the aluminum is reacted with the acid and water.

EMBODIMENT 46 can include, or can optionally be combined with, the subject matter of one or any combination of EMBODIMENTS 1-45, to optionally include the alumina having less than 1 ppmw impurities.

EMBODIMENT 47 can include, or can optionally be combined with, the subject matter of one or any combination of EMBODIMENTS 1-46, to optionally include the alumina comprising less than about 30 ppmw total metallic and alkyl impurities.

EMBODIMENT 48 can include, or can optionally be combined with, the subject matter of one or any combination of EMBODIMENTS 1-47, to optionally include the alumina comprising less than about 5 ppmw total metallic and alkyl impurities.

EMBODIMENT 49 can include, or can optionally be combined with, the subject matter of one or any combination of EMBODIMENTS 1-48, to optionally include the alumina comprising less than about 5 ppmw Na.

EMBODIMENT 50 can include, or can optionally be combined with, the subject matter of one or any combination of EMBODIMENTS 1-49, to optionally include the alumina comprising less than about 5 ppmw Si.

EMBODIMENT 51 can include, or can optionally be combined with, the subject matter of one or any combination of EMBODIMENTS 1-50, to optionally include the alumina comprising less than about 5 ppmw Fe.

EMBODIMENT 52 can include, or can optionally be combined with, the subject matter of one or any combination of EMBODIMENTS 1-51, to optionally include the alumina comprising less than about 5 ppmw Ca.

EMBODIMENT 53 can include, or can optionally be combined with, the subject matter of one or any combination of EMBODIMENTS 1-52, to optionally include the alumina comprising less than about 5 ppmw K.

EMBODIMENT 54 can include, or can optionally be combined with, the subject matter of one or any combination of EMBODIMENTS 1-53, to optionally include the alumina comprising less than about 1 ppmw Ti.

EMBODIMENT 55 can include, or can optionally be combined with, the subject matter of one or any combination of EMBODIMENTS 1-54, to optionally include the alumina comprising less than about 5 ppmw Mg.

EMBODIMENT 56 can include, or can optionally be combined with, the subject matter of one or any combination of EMBODIMENTS 1-55, to optionally include the alumina comprising less than about 1 ppmw Cu.

EMBODIMENT 57 can include, or can optionally be combined with, the subject matter of one or any combination of EMBODIMENTS 1-56, to optionally include the alumina comprising less than about 1 ppmw Cr.

EMBODIMENT 58 can include, or can optionally be combined with, the subject matter of one or any combination of EMBODIMENTS 1-57, to optionally include the reacting of the aluminum, acid, and water being carried out with high-purity materials to avoid or minimize contamination.

EMBODIMENT 59 can include, or can optionally be combined with, the subject matter of one or any combination of EMBODIMENTS 1-58, to optionally include the reacting of the aluminum, acid, and water being carried out in a non-contaminating container.

EMBODIMENT 60 can include, or can optionally be combined with, the subject matter of one or any combination of EMBODIMENTS 1-59, to optionally include the heating of aluminum salt solution to form aluminum salt crystals being carried out in a non-contaminating container.

EMBODIMENT 61 can include, or can optionally be combined with, the subject matter of one or any combination of EMBODIMENTS 1-60, to optionally include the heating of aluminum salt crystals to convert the aluminum salt crystals to aluminum oxide being carried out in a non-contaminating container.

EMBODIMENT 62 can include, or can optionally be combined with, the subject matter of one or any combination of EMBODIMENTS 1-61, to optionally include one or more of the steps being carried out in a plastic vessel.

EMBODIMENT 63 can include, or can optionally be combined with, the subject matter of one or any combination of EMBODIMENTS 1-52, to optionally include one or more of the steps being carried out in a vessel comprising polyvinylidene difluoride (PVDF).

EMBODIMENT 64 can include, or can optionally be combined with, the subject matter of one or any combination of EMBODIMENTS 1-63, to optionally include one or more steps being carried out in a vessel comprising polytetrafluoroethylene (PTFE).

EMBODIMENT 65 can include, or can optionally be combined with, the subject matter of one or any combination of EMBODIMENTS 1-64, to optionally include one or more of the steps being carried out in a vessel comprising fluorinated ethylene propylene (FEP).

EMBODIMENT 66 can include, or can optionally be combined with, the subject matter of one or any combination of EMBODIMENTS 1-65, to optionally include one or more steps being carried out in a vessel comprising and perfluoroalkoxy (PFA).

EMBODIMENT 67 can include, or can optionally be combined with, the subject matter of one or any combination of EMBODIMENTS 1-66, to optionally include one or more steps being carried out in a vessel comprising a high-temperature resistant polyethylene.

EMBODIMENT 68 can include, or can optionally be combined with, the subject matter of one or any combination of EMBODIMENTS 1-67, to optionally include one or more of the steps being carried out in a rubber vessel.

EMBODIMENT 69 can include, or can optionally be combined with, the subject matter of one or any combination of EMBODIMENTS 1-68, to optionally include one or more of the steps being carried out in a ceramic vessel.

EMBODIMENT 70 can include, or can optionally be combined with, the subject matter of one or any combination of EMBODIMENTS 1-69, to optionally include the heating of the aluminum salt crystals being performed in an aluminum oxide crucible.

EMBODIMENT 71 can include, or can optionally be combined with, the subject matter of one or any combination of EMBODIMENTS 1-70, to optionally include the heating of the aluminum salt crystals being performed in a high-purity aluminum oxide crucible.

EMBODIMENT 72 can include, or can optionally be combined with, the subject matter of one or any combination of EMBODIMENTS 1-71, to optionally include scrubbing an exhaust gas from the step of reacting the aluminum, acid, and water.

EMBODIMENT 73 can include, or can optionally be combined with, the subject matter of one or any combination of EMBODIMENTS 1-72, to optionally include scrubbing or condensing an exhaust gas produced from the step of reacting the aluminum, acid, and water.

EMBODIMENT 74 can include, or can optionally be combined with, the subject matter of one or any combination of EMBODIMENTS 1-73, to optionally include scrubbing or condensing an exhaust gas from the step of heating the aluminum salt crystals to convert the aluminum salt crystals to alumina.

EMBODIMENT 75 can include, or can optionally be combined with, the subject matter of one or any combination of EMBODIMENTS 1-74, to optionally include recycling at least one of water and acid from the step of reacting the aluminum, acid, and water.

EMBODIMENT 76 can include, or can optionally be combined with, the subject matter of one or any combination of EMBODIMENTS 1-75, to optionally include recycling at least one of water and acid from the step of heating the aluminum salt crystals to convert the aluminum salt crystals to alumina.

EMBODIMENT 77 can include, or can optionally be combined with, the subject matter of one or any combination of EMBODIMENTS 1-76, to optionally include the aluminum oxide having a melting point of about 2050° C.

EMBODIMENT 78 can include, or can optionally be combined with, the subject matter of one or any combination of EMBODIMENTS 1-77, to optionally include the aluminum oxide comprising aluminum oxide powder.

EMBODIMENT 79 can include, or can optionally be combined with, the subject matter of one or any combination of EMBODIMENTS 1-78, to optionally include the acid comprising a single acid.

EMBODIMENT 80 can include, or can optionally be combined with, the subject matter of one or any combination of EMBODIMENTS 1-79, to optionally include the acid comprising two or more acids.

EMBODIMENT 81 can include, or can optionally be combined with, the subject matter of one or any combination of EMBODIMENTS 1-80, to optionally include the acid comprising an inorganic acid.

EMBODIMENT 82 can include, or can optionally be combined with, the subject matter of one or any combination of EMBODIMENTS 1-81, to optionally include the aluminum being added to the water in order to react the aluminum, acid, and water.

EMBODIMENT 83 can include, or can optionally be combined with, the subject matter of one or any combination of EMBODIMENTS 1-82, to optionally include the aluminum being added to the acid in order to react the aluminum, acid, and water.

EMBODIMENT 84 can include, or can optionally be combined with, the subject matter of one or any combination of EMBODIMENTS 1-83, to optionally include the aluminum being added to a mixture of the water and the acid in order to react the aluminum, acid, and water.

EMBODIMENT 85 can include, or can optionally be combined with, the subject matter of one or any combination of EMBODIMENTS 1-84, to optionally include the acid being added to the aluminum in order to react the aluminum, acid, and water.

EMBODIMENT 86 can include, or can optionally be combined with, the subject matter of one or any combination of EMBODIMENTS 1-85, to optionally include the acid being added to a mixture of the aluminum and the water in order to react the aluminum, acid, and water.

EMBODIMENT 87 can include, or can optionally be combined with, the subject matter of one or any combination of EMBODIMENTS 1-86, to optionally include the aluminum oxide being obtained in a yield of at least about 90 molar percent, relative to the acid.

EMBODIMENT 88 can include, or can optionally be combined with, the subject matter of one or any combination of EMBODIMENTS 1-87, to optionally include the process being carried out in a batch mode.

EMBODIMENT 89 can include, or can optionally be combined with, the subject matter of one or any combination of EMBODIMENTS 1-88, to optionally include a molar excess of aluminum is employed, and residual aluminum remaining after a batch process is employed in a subsequent batch process.

EMBODIMENT 90 can include, or can optionally be combined with, the subject matter of one or any combination of EMBODIMENTS 1-89, to optionally include the aluminum oxide comprising alpha aluminum oxide.

EMBODIMENT 92 can include aluminum oxide obtained from one or any combination of the processes of EMBODIMENTS 1-90.

EMBODIMENT 92 can include aluminum oxide powder obtained from one or any combination of the processes of EMBODIMENTS 1-91.

The above Detailed Description is intended to be illustrative, and not restrictive. For example, the above-described examples (or one or more elements thereof) can be used in combination with each other. Other embodiments can be used, such as by one of ordinary skill in the art upon reviewing the above description. Also, various features or elements can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented, at least in part. Some examples can include a computer-readable medium or machine-readable medium encoded with instructions operable to configure an electronic device to perform methods or method steps as described in the above examples. An implementation of such methods or method steps can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

What is claimed is:

1. A method comprising:
   (a) in a heated non-contaminating vessel, contacting high-purity acid, high-purity aluminum and high-purity water to form a first solution, wherein the high-purity aluminum is employed in at least a stoichiometric amount relative to the acid;
   (b) in a non-contaminating container, heating the first solution, to provide a mother liquor and solid aluminum salts;
   (c) separating the solid aluminum salts from the mother liquor;
   (d) in a non-contaminating crucible, heating the solid aluminum salts, to provide alpha aluminum oxide; and
   (e) optionally washing the alpha aluminum oxide with high-purity water after some or all of the heating of step (d) to provide a washed alpha aluminum oxide, wherein one or both of the alpha aluminum oxide provided by the heating of step (d) or the washed alpha aluminum oxide provided by the washing of step (e) is at least about 99.99 wt % pure aluminum oxide.

2. The method of claim 1, further comprising, after step (c):
   (f) dissolving the solid aluminum salts in high-purity water or high-purity acid, and repeating steps (b) and (c) one or more times, to provide subsequent solid aluminum salts in a subsequent solution; and
   (g) separating the subsequent solid aluminum salts from the subsequent solution;
   wherein step (d) comprises heating the subsequent solid aluminum salts separated in step (g) to provide the alpha aluminum oxide.

3. The method of claim 1, after step (a); (h) separating solids from the first solution to provide a filtered solution.

4. The method of claim 1, wherein the high-purity aluminum is employed in a molar equivalent or in molar excess relative to the high-purity acid.

5. The method of claim 1, wherein the alpha aluminum oxide comprises less than about 30 ppmw total metallic and alkyl impurities.

6. The method of claim 1, wherein the alpha aluminum oxide comprises less than about 5 ppmw of each of Na, Si, Fe, Ca, K, and Mg and less than about 1 ppmw of each of Ti, Cu, and Cr.

7. The method of claim 1, wherein the high-purity aluminum is at least about 99.98 wt. % pure aluminum.

8. The method of claim 1, wherein the high-purity acid comprises less than about 1 ppmw of each of Na, Ca, Li, Fe, Zn, Cu, Ti, Cr, K and Mg.

9. The method of claim 1, wherein the high-purity acid comprises less than about 0.2 ppmw metallic impurities.

10. The method of claim 1, wherein the high-purity water is at least about 99.999 wt. % pure water.

11. The method of claim 1, wherein the alpha aluminum oxide is obtained in a yield of at least about 90 molar percent, relative to the high-purity acid.

12. The method of claim 1, further comprising venting the non-contaminating vessel with air during the contacting of the high-purity aluminum, the high-purity acid, and the high-purity water to dilute a hydrogen level in the vessel.

13. A method comprising:
   (a) contacting high-purity acid, high-purity aluminum, and high-purity water in a non-contaminating vessel to form a first solution;
   (b) at least one of heating and gas injecting the first solution, to provide a mother liquor and solid aluminum salts;
   (c) separating the solid aluminum salts from the mother liquor;
   (d) heating the solid aluminum salts, to provide alpha aluminum oxide; and
   (e) washing the alpha aluminum oxide, to provide washed alpha aluminum oxide, wherein one or both of the alpha aluminum oxide provided by the heating of step (d) or the washed alpha aluminum oxide provided by the washing of step (e) is at least about 99.99 wt % pure aluminum oxide.

14. The method of claim 13, wherein the first solution comprises first solids and a first liquid, the method further comprising, subsequent to step (a), (f) separating the first liquid from the first solids to provide a filtered first solution, wherein step (b) comprises at least one of heating and gas injecting the filtered first solution.

15. The method of claim 13, further comprising:
subsequent to step (c) and before step (d), (g) dissolving the solid aluminum salts in water or acid, and repeating steps (b) and (c) one or more times, to provide subsequent solid aluminum salts in a subsequent solution; and
(h) separating the subsequent solid aluminum salts from the subsequent solution; wherein step (d) comprises heating the subsequent solid aluminum salts to provide the alpha aluminum oxide.

16. The method of claim 13, wherein the high-purity aluminum is employed in a molar equivalent or in a molar excess, relative to the high-purity acid.

17. The method of claim 13, wherein the alpha aluminum oxide comprises less than about 30 ppmw total metallic and alkyl impurities.

18. The method of claim 13, wherein the high-purity aluminum is at least about 99.98 wt. % pure aluminum.

19. The method of claim 13, wherein the high-purity acid comprises less than about 1 ppmw of each of Na, Ca, Li, Fe, Zn, Cu, Ti, Cr, K and Mg.

20. The method of claim 13, wherein the high-purity water is at least about 99.999 wt. % pure water.

21. The method of claim 13, wherein the alpha aluminum oxide is obtained in a yield of at least about 90 molar percent, relative to the high-purity acid.

* * * * *

UNITED STATES PATENT AND TRADEMARK OFFICE
CERTIFICATE OF CORRECTION

| | |
|---|---|
| PATENT NO. | : 9,751,775 B2 |
| APPLICATION NO. | : 14/652161 |
| DATED | : September 5, 2017 |
| INVENTOR(S) | : Nichol |

Page 1 of 1

It is certified that error appears in the above-identified patent and that said Letters Patent is hereby corrected as shown below:

On the Title Page

Item (71), in "Applicant", in Column 1, Line 1, after "Toronto", insert --, Ontario--

Item (72), in "Inventor", in Column 1, Line 1, after "Toronto", insert --, Ontario--

In the Claims

In Column 23, Line 16, in Claim 15, after "solution;", insert --¶--

Signed and Sealed this
Twenty-third Day of June, 2020

Andrei Iancu
*Director of the United States Patent and Trademark Office*